United States Patent
Choi et al.

(10) Patent No.: US 10,795,259 B2
(45) Date of Patent: Oct. 6, 2020

(54) PHOTO-CURABLE AND HEAT-CURABLE RESIN COMPOSITION AND DRY FILM SOLDER RESIST

(71) Applicant: LG CHEM, LTD., Seoul (KR)

(72) Inventors: Byung Ju Choi, Daejeon (KR); You Jin Kyung, Daejeon (KR); Woo Jae Jeong, Daejeon (KR); Bo Yun Choi, Daejeon (KR); Min Su Jeong, Daejeon (KR)

(73) Assignee: LG CHEM, LTD., Seoul (KR)

( * ) Notice: Subject to any disclaimer, the term of this patent is extended or adjusted under 35 U.S.C. 154(b) by 380 days.

(21) Appl. No.: 15/764,544

(22) PCT Filed: Feb. 3, 2017

(86) PCT No.: PCT/KR2017/001214
§ 371 (c)(1),
(2) Date: Mar. 29, 2018

(87) PCT Pub. No.: WO2017/135751
PCT Pub. Date: Aug. 10, 2017

(65) Prior Publication Data
US 2019/0056658 A1 Feb. 21, 2019

(30) Foreign Application Priority Data
Feb. 5, 2016 (KR) .................. 10-2016-0015303

(51) Int. Cl.
*G03F 7/004* (2006.01)
*G03F 7/027* (2006.01)
(Continued)

(52) U.S. Cl.
CPC .............. *G03F 7/0047* (2013.01); *C08F 2/44* (2013.01); *C08F 2/50* (2013.01); *C08F 122/14* (2013.01);
(Continued)

(58) Field of Classification Search
CPC .................. G03F 7/029; G08K 7/00
See application file for complete search history.

(56) References Cited

U.S. PATENT DOCUMENTS

| | | |
|---|---|---|
| 4,943,516 A | 7/1990 | Kamayachi et al. |
| 9,201,299 B2 | 12/2015 | Kounou et al. |

(Continued)

FOREIGN PATENT DOCUMENTS

| | | |
|---|---|---|
| CN | 101798432 A | 8/2010 |
| CN | 101845216 A | 9/2010 |

(Continued)

OTHER PUBLICATIONS

Supova et al, "Effect of Nanofillers Dispersion in Polymer Matrices: A Review", Science of Advanced Materials, vol. 3, oages 1-25, year 2011, (Year: 2011).*

(Continued)

*Primary Examiner* — Cynthia Hamilton
(74) *Attorney, Agent, or Firm* — Rothwell, Figg, Ernst & Manbeck, P.C.

(57) ABSTRACT

The present invention relates to a photo-curable and heat-curable resin composition including: an acid-modified oligomer having a photo-curable functional group having an acrylate group or an unsaturated double bond, and a carboxyl group in the molecule; a photopolymerizable monomer having at least two photo-curable unsaturated functional groups; a heat-curable binder having a heat-curable functional group; a plate-like inorganic filler having an E-modulus of 90 to 120 (Gpa); a dispersant; and a photo-initiator, and a dry film solder resist prepared therefrom.

20 Claims, 3 Drawing Sheets

(51) Int. Cl.
*G03F 7/029* (2006.01)
*C08F 2/50* (2006.01)
*C08F 2/44* (2006.01)
*H05K 3/34* (2006.01)
*C08L 35/02* (2006.01)
*C09D 4/00* (2006.01)
*C08K 7/00* (2006.01)
*C08F 122/14* (2006.01)
*C08K 3/34* (2006.01)
*H05K 3/28* (2006.01)

(52) U.S. Cl.
CPC ................ *C08K 7/00* (2013.01); *C08L 35/02* (2013.01); *C09D 4/00* (2013.01); *G03F 7/027* (2013.01); *G03F 7/029* (2013.01); *H05K 3/3452* (2013.01); *C08K 3/34* (2013.01); *H05K 3/287* (2013.01); *H05K 2203/068* (2013.01)

(56) References Cited

U.S. PATENT DOCUMENTS

| | | | |
|---|---|---|---|
| 9,416,243 | B2 | 8/2016 | Choi et al. |
| 9,880,467 | B2 | 1/2018 | Jeong et al. |
| 2007/0037913 | A1 | 2/2007 | Heck |
| 2007/0037914 | A1 | 2/2007 | Heck et al. |
| 2009/0087775 | A1 | 4/2009 | Kunou et al. |
| 2011/0151146 | A1 | 6/2011 | Okano et al. |
| 2012/0301824 | A1 | 11/2012 | Yoshida et al. |
| 2012/0301825 | A1 | 11/2012 | Yoshida et al. |
| 2013/0076458 | A1 | 3/2013 | Katou et al. |
| 2014/0158413 | A1 | 6/2014 | Shanai et al. |
| 2015/0185603 | A1 | 7/2015 | Yoshida et al. |
| 2015/0185611 | A1 | 7/2015 | Katou et al. |

FOREIGN PATENT DOCUMENTS

| | | | |
|---|---|---|---|
| CN | 101852988 | A | 10/2010 |
| CN | 103376653 | A | 10/2013 |
| CN | 103865468 | A | 6/2014 |
| CN | 102754031 | B | 8/2014 |
| CN | 104423165 | A | 3/2015 |
| CN | 105353588 | A | 2/2016 |
| CN | 106019829 | A | 10/2016 |
| JP | H01-141904 | A | 6/1989 |
| JP | 2007-201453 | A | 8/2007 |
| JP | 2008-088041 | A | 4/2008 |
| JP | 2009-102623 | A | 5/2009 |
| JP | 2009-194235 | A | 8/2009 |
| JP | 2009-294319 | A | 12/2009 |
| JP | 2011-095705 | A | 5/2011 |
| JP | 2012-004487 | A | 1/2012 |
| JP | 2012-142255 | A | 7/2012 |
| JP | 2012-207212 | A | 10/2012 |
| JP | 5707779 | B2 | 4/2015 |
| KR | 10-2008-0040636 | A | 5/2008 |
| KR | 10-2013-0084238 | A | 7/2013 |
| KR | 10-2014-0028249 | A | 3/2014 |
| KR | 10-2014-0134465 | A | 11/2014 |
| KR | 10-1459199 | B1 | 11/2014 |
| KR | 10-2014-0146545 | A | 12/2014 |
| KR | 10-1545724 | B1 | 8/2015 |
| KR | 10-20160005873 | A * | 1/2016 |
| WO | 2010-024115 | A1 | 3/2010 |
| WO | 2013-146748 | A1 | 10/2013 |

OTHER PUBLICATIONS

Translation of KR 10-2016-0005873 A, generated Apr. 16, 2020 fro KIPO website, 21 pages (Year: 2020).*
Katyar et al, Wear, 362-363, pp. 199-208, published Jun. 17, 2016. (Year: 2016).*
Website, Nippon Talc Co., Ltd., Product Information, Dec. 26, 2015 (https://web.archive.org/web/20150420035727/http://www.nippon-talc.co.jp:80/seihin.html), (8 pages).
Website, Nippon Talc Co., Ltd., Product Information, May 29, 2015 (https://web.archive.org/web/20150529004346/http://www.nippon-talc.co.jp/seihin_e.html), (8 pages).
Search Report and Written Opinion issued for International Application No. PCT/KR2017/001214 dated May 12, 2017 (15 pages).

* cited by examiner

[FIG. 1]

| | Example 1 | Comparative Example 1 | Comparative Example 2 |
|---|---|---|---|
| Filler | Plate Filler + dispersant | No Filler | Spher Filler + dispersant |
| Filler content (Volume ratio of filler in solid content) | 30 | 0 | 15 |
| E-modulus (Gpa) | 10.0 | 2.8 | 4.5 |
| SEM | 45um | 45um | 53um |

| | Comparative Example 3 | Comparative Example 4 | Comparative Example 5 |
|---|---|---|---|
| Filler | Spher Filler + dispersant | Spher Filler + dispersant | Plate Filler + dispersant |
| Filler content (Volume ratio of filler in solid content) | 35 | 55 | 30 |
| E-modulus (Gpa) | 6.5 | 11 | 9.8 |
| SEM | 50um | fail | fail |

[FIG. 2]
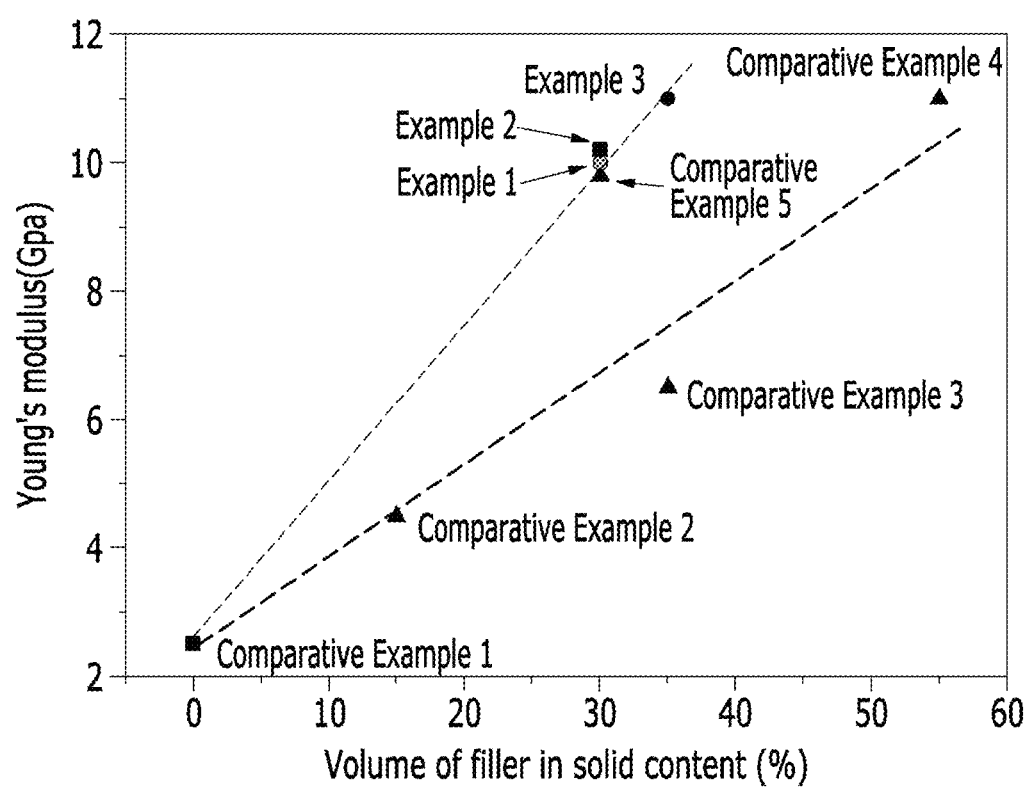

[FIG. 3]
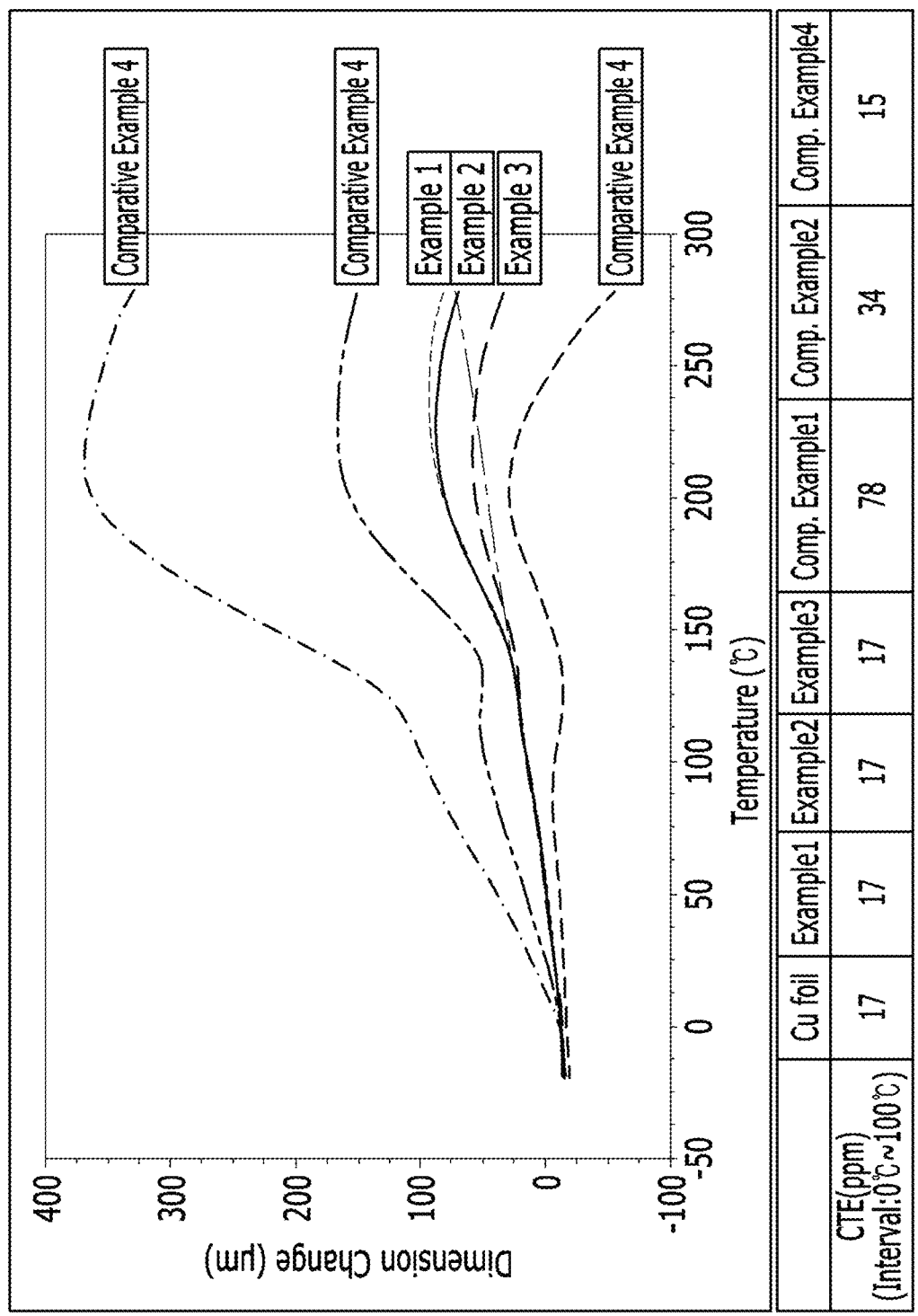

PHOTO-CURABLE AND HEAT-CURABLE RESIN COMPOSITION AND DRY FILM SOLDER RESIST

CROSS-REFERENCE TO RELATED APPLICATION(S)

This application is a 35 U.S.C. 371 National Phase Entry Application from PCT/KR2017/001214, filed Feb. 3, 2017, which claims the benefit of priority from Korean Patent Application No. 10-2016-0015303 filed on Feb. 5, 2016 with the Korean Intellectual Property Office, the disclosures of which are incorporated herein by reference in their entirety.

TECHNICAL FIELD

The present invention relates to a photo-curable and heat-curable resin composition and a dry film solder resist. More specifically, the present invention relates to a photo-curable and heat-curable resin composition which has excellent mechanical properties and can implement a low coefficient of thermal expansion and a high modulus, while enabling the formation of fine patterns required in a dry film solder resist (DFSR), and to a dry film-type solder resist having the properties described above.

BACKGROUND ART

As various electronic devices are miniaturized and become more lightweight, a photosensitive solder resist capable of forming a fine opening pattern is used in a printed circuit board, a semiconductor package substrate, a flexible circuit substrate, etc.

A semiconductor package product is a complex material consisting of non-conductors such as epoxy molding or solder resist, semiconductors such as chip die and conductors such as board circuit patterns, and in order to prepare the product, several processes accompanying severe heat shock conditions are required. However, problems of dimensional instability and warpage phenomena of parts appear due to differences in coefficients of thermal expansion (CTE) of the non-conductor, semiconductor, and conductor. When a chip die and a semiconductor substrate are connected by a solder ball or a gold wire, such phenomena may cause a position mismatch between the chip and the substrate, and a crack and rupture of a product may occur due to the shear stress, which may affect the life of the product.

In recent years, as the thickness of the substrate has gradually become thinner, such problems of the dimensional instability and warpage phenomena have become more serious. In order to solve the problems, materials are being developed such that they minimize the CTE mismatch between the materials. Further, the development of a solder resist having a lower coefficient of thermal expansion has been consistently required.

A previously known dry film-type solder resist (DFSR: Dry Film Solder Resist) has a coefficient of thermal expansion which has $\alpha 1$ (coefficient of thermal expansion before Tg) of 45 to 70 ppm and $\alpha 2$ (coefficient of thermal expansion after Tg) of 140 to 170 ppm.

As for a core among the current substrate materials, it has been reported that materials having a coefficient of thermal expansion of 10 ppm or less or 5 ppm or less are being developed. However, the development of a material for a solder resist that can be used along with the core has not yet been reported.

In addition, attempts have been made to lower the coefficient of thermal expansion of the solder resist by increasing the content of a filler used. However, if the content of the filler is increased to above a certain level, a poor coating phenomenon may be caused due to filler cohesion, and an elongation percentage ratio between after coating and before curing may be reduced, which may result in problems such as deterioration in workability.

The solder resist generally requires characteristics such as a developing property, high resolution, an insulating property, an adhesive property, soldering heat resistance, gold plating resistance, and the like. Particularly, in addition to said characteristics, for example, the characteristic of crack resistant against a temperature cycle test (TCT) from −65° C. to 150° C., or of a highly-accelerated stress test (HAST) to fine wiring are required of the solder resist for a semiconductor package substrate.

Recently, as the solder resist, a dry film-type solder resist that is superior in uniformity of film thickness, surface smoothness, and thin film-forming property has received attention. Such a dry film-type solder resist can impart the merits of simplification of a resist-forming process, or a reduction of solvent discharged in the resist-forming process, in addition to said characteristics.

In the past, a photo-curable and heat-curable resin composition including a photopolymerizable monomer such as a polyfunctional acrylate together with an acid-modified oligomer, a photo-initiator, and a heat-curable binder has been used for forming the solder resist.

However, the solder resist formed from the resin composition does not show a high glass transition temperature or sufficient heat resistance reliability. Thus, it has disadvantages of not satisfying the PCT resistance, TCT heat resistance, HAST resistance to fine wiring, and the like that are required for a package substrate material of a semiconductor device.

Further, the Young's modulus value of the existing solder resists is 3 to 5 Gpa, which depends on the filler content of 5 to 20 vol % in the solid content of the solder resists. Furthermore, when the resin is used only in the solder resist without adding a filler, the Young's modulus value is 2.5 Gpa.

Although it is common to increase the filler content in order to increase the modulus and reduce the CTE, when the filler content exceeds 20 vol % in the solid content of the solder resist, the formation of fine patterns may be unfavorable.

DETAILED DESCRIPTION OF THE INVENTION

Technical Problem

One objective of the present invention is to provide a photo-curable and heat-curable resin composition providing a dry film-type solder resist which has a particularly low coefficient of thermal expansion and excellent mechanical properties, can implement a high modulus, enables the formation of fine patterns, and is advantageous in terms of warpage, while satisfying basic physical properties required in a dry film-type solder resist.

Further, another objective of the present invention is to provide a dry film-type solder resist (DFSR) which has a particularly low coefficient of thermal expansion and excellent mechanical properties, can implement a high modulus, enables the formation of fine patterns, and is advantageous in terms of warpage, while satisfying basic physical properties required in a dry film-type solder resist.

Furthermore, still another objective of the present invention is to provide a film-type photo-curable and heat-curable resin composition having excellent mechanical properties that are useful for the production of a package substrate of a semiconductor device, and a dry film resist using a cured product thereof.

Technical Solution

In the present specification, a photo-curable and heat-curable resin composition is provided, including an acid-modified oligomer having a photo-curable functional group having an acrylate group or an unsaturated double bond, and a carboxyl group in a molecule; a photopolymerizable monomer having at least two photo-curable unsaturated functional groups; a heat-curable binder having a heat-curable functional group; a plate-like inorganic filler having an E-modulus of 90 to 120 (Gpa); a dispersant; and a photo-initiator, wherein the plate-like inorganic filler includes a plate-like talc powder having whiteness of 90% or higher, a particle size (D50) of 0.5 to 2 µm, a top size of 3 to 10 µm, a water content of 0.3 to 1% measured by JIS-K5101, an apparent density of 0.07 to 0.2 g/ml, and a specific surface area of 17 to 30 m$^2$/g measured by the BET method.

Preferably, the plate-like inorganic filler may include a plate-like talc powder having whiteness of 96% or higher, a particle size (D50) of 0.6 to 1.5 µm, a top size of 4 to 7 µm, a water content of 0.5 to 0.7% measured by JIS-K5101, an apparent density of 0.09 to 0.1 g/ml, and a specific surface area of 18 to 24 m$^2$/g measured by the BET method.

The plate-like inorganic filler may be contained in an amount of 20% by weight to 60% by weight in the solid content of the total composition. Further, preferably, the plate-like inorganic filler may be contained in an amount of 40% by weight to 55% by weight in the solid content of the total composition.

The acid-modified oligomer may include an epoxy (meth) acrylate-based compound.

The acid-modified oligomer may be contained in an amount of 5% by weight to 75% by weight based on the total weight of the resin composition.

The photopolymerizable monomer may include an acrylate-based compound having at least two photo-curable unsaturated functional groups.

The photopolymerizable monomer may include a hydroxyl group-containing acrylate-based compound, a water-soluble acrylate-based compound, a polyester acrylate-based compound, a polyurethane acrylate-based compound, an epoxy acrylate-based compound, a caprolactone modified-acrylate-based compound, or a mixture of two or more thereof.

The photopolymerizable monomer may be contained in an amount of 5% by weight to 30% by weight based on the total weight of the resin composition.

The photo-initiator may include at least one selected from the group consisting of benzoins and alkyl ethers thereof, acetophenones, anthraquinones, thioxanthones, ketals, benzophenones, α-aminoacetophenones, acylphosphine oxides, and oxime esters.

The photo-initiator may be contained in an amount of 0.5% by weight to 30% by weight based on the total weight of the resin composition.

The heat-curable functional group may be at least one selected from the group consisting of an epoxy group, an oxetanyl group, a cyclic ether group, and a cyclic thioether group.

The heat-curable binder may be contained in an amount corresponding to 0.5 to 2.0 equivalents based on 1 equivalent of a carboxyl group of the acid-modified oligomer.

The photo-curable and heat-curable resin composition may further include a solvent; and at least one selected from the group consisting of an epoxy curing agent, a heat-curable binder catalyst, a pigment, and an additive.

Further, in the present specification, a dry film solder resist is provided, including: a cured product of an acid-modified oligomer having a photo-curable functional group having an acrylate group or an unsaturated double bond, and a carboxyl group in a molecule; a photopolymerizable monomer having at least two photo-curable unsaturated functional groups; and a heat-curable binder having a heat-curable functional group, and a plate-like inorganic filler having an E-modulus of 90 to 120 (Gpa) which is dispersed in the cured product.

The cured product may include a cross-linked structure in which a photo-curable functional group of the acid-modified oligomer and a heat-curable functional group of the heat-curable binder are cross-linked; a cross-linked structure in which a photo-curable functional group of the acid-modified oligomer and an unsaturated functional group of the photopolymerizable monomer are cross-linked to each other; and a cross-linked structure derived from the acid-modified oligomer.

The dry film solder resist may have a coefficient of thermal expansion of less than 20 ppm/K. The dry film solder resist may have a Young's modulus of 9 to 11 Gpa.

The plate-like organic filler may include a plate-like talc powder having whiteness of 90% or higher, a particle size (D50) of 0.5 to 2 µm, a top size of 3 to 10 µm, a water content of 0.3 to 1% measured by JIS-K5101, an apparent density of 0.07 to 0.2 g/ml, and a specific surface area of 17 to 30 m$^2$/g measured by the BET method.

The dry film solder resist may contain the plate-like organic filler in an amount of 20% by weight to 60% by weight of the solid content of the solder resist.

Advantageous Effects

According to the present invention, a dry film-type solder resist (DFSR) which has a particularly low coefficient of thermal expansion and excellent mechanical properties, can implement a high modulus, enables the formation of fine patterns, and is advantageous in terms of warpage, while satisfying basic physical properties required in a dry film-type solder resist, by using a photosensitive resin composition including a plate-like inorganic filler having a high modulus and a specific physical property together with a dispersant, may be provided.

BRIEF DESCRIPTION OF DRAWINGS

FIG. 1 is an electron microscopic image (SEM) showing the results of the fine pattern formation of Example 1 of the present invention and Comparative Examples 1 to 5 for comparison.

FIG. 2 is a graph showing the Young's modulus according to the filler content of Examples 1 to 3 of the present invention and Comparative Examples 1 to 5 for comparison.

FIG. 3 is a graph showing the coefficient of thermal expansion according to temperature of Examples 1 to 3 and Comparative Examples 1, 2 and 4 for comparison.

DETAILED DESCRIPTION OF THE EMBODIMENTS

Hereinafter, the photo-curable and heat-curable resin composition and DFSR according to the embodiments of the present invention will be described in more detail.

According to one embodiment of the present invention, a photo-curable and heat-curable resin composition is provided, including: an acid-modified oligomer having a photo-curable functional group having an acrylate group or an unsaturated double bond, and a carboxyl group in a molecule; a photopolymerizable monomer having at least two photo-curable unsaturated functional groups; a heat-curable binder having a heat-curable functional group; a plate-like inorganic filler having an E-modulus of 90 to 120 (Gpa); a dispersant; and a photo-initiator, wherein the plate-like inorganic filler includes a plate-like talc powder having whiteness of 90% or higher, a particle size (D50) of 0.5 to 2 μm, a top size of 3 to 10 μm, a water content of 0.3 to 1% measured by JIS-K5101, an apparent density of 0.07 to 0.2 g/ml, and a specific surface area of 17 to 30 m$^2$/g measured by the BET method.

The photo-curable and heat-curable resin composition of the present invention refers to a photosensitive resin composition. Such a resin composition of the present invention uses a plate-like inorganic filler having a specific modulus and contains a certain amount thereof, and thus, even if the filler content exceeds 20 vol % in the solid content of the solder resist, it enables the formation of fine patterns and can implement a low coefficient of thermal expansion (CTE) and a high modulus required in a solder resist. Therefore, it may provide a dry film-type solder resist which is advantageous in terms of warpage and excellent in mechanical properties.

The E-modulus refers to the Young's modulus, which is an elastic modulus indicating the degree of stretching and deformation of an object when stretched from both sides. Specifically, it can be measured by a universal test machine according to ISO 527 and ASTM D638 standards.

The photo-curable and heat-curable resin composition may include the above-described acid-modified oligomer, photopolymerizable monomer, photo-initiator, heat-curable binder, plate-like inorganic filler having a specific physical property and dispersant.

The resin composition of one embodiment can be used to form a DFSR through the following processes. First, a film is formed by the resin composition, this film is laminated on a given substrate, and then the resin composition of the part on which DFSR will be formed is selectively exposed to light. Thereafter, when development is performed using an alkali solution, the light exposed part of the resin composition in which a cross-linked structure is formed remains on the substrate, and the remaining non-light exposed part of the resin composition can be dissolved in the developing solution and eliminated.

Then, when a heat-curing process is carried out by heat-treating the resin composition remaining on the substrate, the acid-modified oligomer, for example, the carboxyl group, can react with the heat-curable functional group of the heat-curable binder to form a cross-linked bond, and consequently, a cross-linked structure is formed by the heat-curing, and the DFSR can be formed on the desired part of the board.

Herein, the resin composition may have a secondary cross-linked structure in the heat-curing process. In addition, when the resin composition is used to form the DFSR, as the cured product of the resin composition constituting the DFSR includes the cross-linked structure and the amount of the other residual compound is minimized, a higher developing property can be secured, and accordingly, a fine pitch can be easily implemented. Further, when the photo-curable and heat-curable resin composition is used, a dry film solder resist having physical properties such as low alpha particle emission, low dielectric constant, low coefficient of thermal expansion, excellent heat resistance reliability, etc., may be provided. Particularly, the composition may provide a DFSR having minimized warpage and excellent mechanical properties.

The photo-curable and heat-curable resin composition may contain 20% by weight to 60% by weight (solid content) of the plate-like inorganic filler in the solid content of the total composition. When the solid content is converted into a volume ratio of the resin composition, it may correspond to 20 to 40 vol % or 30 to 35 vol % of the solid content of the total resin composition.

The plate-like inorganic filler may include a plate-like talc powder having whiteness of 90% or higher, a particle size (D50) of 0.5 to 2 μm, a top size of 3 to 10 μm, a water content of 0.3 to 1% measured by JIS-K5101, an apparent density of 0.07 to 0.2 g/ml, and a specific surface area of 17 to 30 m$^2$/g measured by the BET method.

Specifically, the plate-like inorganic filler may preferably include a plate-like talc powder having whiteness of 96% or higher, a particle size (D50) of 0.6 to 1.5 μm, a top size of 4 to 7 μm, a water content of 0.5 to 0.7% measured by JIS-K5101, an apparent density of 0.09 to 0.1 g/ml, and a specific surface area of 18 to 24 m$^2$/g measured by the BET method.

The photo-curable and heat-curable resin composition of one embodiment may contain 20 to 60% by weight, 40 to 55% by weight, or 45 to 55% by weight of the inorganic filler in the solid content of the total composition. If the content of the inorganic filler is too low, the hardness and stiffness of the finally prepared DFSR may not be sufficiently secured, thereby decreasing the workability, and the effect due to the addition of the inorganic filler may not be fully exhibited. Further, if the content of the inorganic filler is too high, the inorganic filler may not be easily dispersed in the photo-curable and heat-curable resin composition of one embodiment, and may not be easily coated onto the substrate as the viscosity of the resin composition is significantly increased, and accordingly, it may be difficult to prepare the dry film solder resist, and the elongation percentage of the finally prepared dry film solder resist, etc. may decrease.

Herein, in the present invention, the solid content of the plate-like inorganic filler in the entire resin composition refers to a value calculated in consideration of only the components excluding the solvent and volatile components.

In addition, the volume ratio of the plate-like inorganic filler in the total resin composition refers to a value calculated in consideration of the density of each filler and resin.

Hereinafter, the resin composition according to one embodiment will be described in more detail for each component.

Acid-Modified Oligomer

In the resin composition, it may be favorable if the resin used together with the filler has a higher crystallization tendency and a higher inter/intra interaction. That is, the higher the attraction between the polymer chains, the more favorable it will be.

The resin composition of one embodiment may include a commonly known acid-modified oligomer.

As for the acid-modified oligomer, all components known to be usable in the resin composition for forming DFSR as oligomers having a carboxyl group and a photo-curable functional group, for example, a photo-curable functional group having an acrylate group or an unsaturated double bond, and a carboxyl group in the molecule may be used without limitation. For example, the main chain of such an additional acid-modified oligomer may be a novolac epoxy or polyurethane, etc., and the component in which a carboxyl group and an acrylate group, etc. are introduced to the main chain may be used as an additional acid-modified oligomer.

The photo-curable functional group may preferably be an acrylate group. Herein, the acid-modified oligomer may be obtained in the form of an oligomer by copolymerizing a polymerizable monomer having a carboxyl group and a monomer including an acrylate-based compound.

More specifically, specific examples of the additional second acid-modified oligomer usable to the resin composition are as follows:

(1) a carboxyl group-containing resin obtained by copolymerizing (a) an unsaturated carboxylic acid such as (meth) acrylic acid, and (b) a compound having an unsaturated double bond such as styrene, α-methyl styrene, a lower alkyl(meth)acrylate, isobutylene or the like;

(2) a carboxyl group-containing photosensitive resin obtained by reacting a portion of the copolymer of (a) the unsaturated carboxylic acid and (b) the compound having unsaturated double bond with a compound having an ethylenically unsaturated group such as a vinyl group, an allyl group, a (meth)acryloyl group or the like, and a reactive group such as an epoxy group, or acyl chloride, for example glycidyl (meth)acrylate, and then adding an ethylenically unsaturated group thereto as a pendant;

(3) a carboxyl group-containing photo-sensitive resin obtained by reacting a copolymer of (c) a compound having an epoxy group and an unsaturated double bond such as glycidyl (meth)acrylate, α-methylglycidyl(meth)acrylate or the like, and (b) the compound having the unsaturated double bond with (a) the unsaturated carboxylic acid, and then reacting the produced secondary hydroxyl group with (d) a saturated or unsaturated polybasic acid anhydride such as phthalic anhydride, tetrahydrophthalic anhydride, hexahydrophthalic anhydride or the like;

(4) a carboxyl group-containing photosensitive resin obtained by reacting the copolymer of (e) an acid anhydride having an unsaturated double bond such as maleic anhydride, itaconic anhydride or the like, and (b) the compound having an unsaturated double bond with (f) a compound having one hydroxyl group and one or more ethylenically unsaturated double bonds such as hydroxyalkyl(meth)acylate;

(5) a carboxyl group-containing photosensitive compound obtained by esterification (complete or partial esterification, preferably complete esterification) of (g) a polyfunctional epoxy compound having two or more epoxy groups in a molecule to be disclosed below or an epoxy group of a polyfunctional epoxy resin obtained by additional epoxidation of a hydroxy group of the polyfunctional epoxy compound with epichlorohydrin, with a carboxyl group of (h) an unsaturated monocarboxylic acid such as a (meth)acrylic acid or the like, followed by additional reaction of the produced hydroxyl group with (d) saturated or unsaturated polybasic acid anhydride;

(6) a carboxyl group-containing resin obtained by reacting an epoxy group of a copolymer of (b) the compound having an unsaturated double bond and glycidyl (meth)acrylate with (i) an organic acid having one carboxyl group in one molecule such as a $C_2$-$C_{17}$ alkylcarboxylic acid or an aromatic group-containing alkylcarboxylic acid, but not having ethylenically unsaturated bond, and then reacting the produced secondary hydroxyl group with (d) a saturated or unsaturated polybasic acid anhydride;

(7) a carboxyl group-containing urethane resin obtained by polyaddition reaction of (j) a diisocyanate such as an aliphatic diisocyanate, a branched aliphatic diisocyanate, an alicyclic diisocyanate, or an aromatic diisocyanate, (k) a carboxyl group-containing dialcohol compound such as dimethylol propionic acid, or dimethylolbutanoic acid, and (m) a diol compound such as a polycarbonate-based polyol, a polyether-based polyol, a polyester-based polyol, a polyolefin-based polyol, an acryl-based polyol, a bisphenol A-based alkyleneoxide adduct diol, and a compound having a phenolic hydroxyl group and an alcoholic hydroxyl group, or the like;

(8) a carboxyl group-containing photosensitive urethane resin obtained by polyaddition reaction of (j) diisocyanate, (n) (meth)acrylate of a bifunctional epoxy resin such as a bisphenol A-type epoxy resin, a hydrogenated bisphenol A-type epoxy resin, a brominated bisphenol A-type epoxy resin, a bisphenol F-type epoxy resin, a bisphenol S-type epoxy resin, a bixylenol-type epoxy resin, a biphenol-type epoxy resin, or the like, or a partially modified acid anhydride thereof, (k) a carboxyl group-containing dialcohol compound, and (m) a diol compound;

(9) a carboxyl group-containing urethane resin obtained by adding (f) the compound having one hydroxy group such as hydroxyalkyl(meth)acrylate, or the like, and having at least one ethylenically unsaturated double bond during the synthesis of the resin described in (7) or (8) to introduce an unsaturated double bond at the end;

(10) a carboxyl group-containing urethane resin obtained by adding a compound having one isocyanate group and one or more (meth)acryloyl groups and one or more (meth) acryloyl groups in a molecule, such as an equimolar reaction product of isophorone diisocyanate and pentaerythritol triacrylate, during the synthesis of the resin described in (7) or (8), and introducing a (meth)acryl group at the end of the resultant product;

(11) a carboxyl group-containing photosensitive resin obtained by reacting a polyfunctional oxetane compound having two or more oxetane rings in a molecule to be disclosed below with (h) the unsaturated monocarboxylic acid to obtain a modified oxetane compound, and reacting the primary hydroxyl group of the obtained modified oxetane compound with (d) the saturated or unsaturated polybasic acid anhydride;

(12) a carboxyl group-containing photosensitive resin obtained by introducing an unsaturated double bond into a reaction product of a bisepoxy compound and bisphenol, followed by reaction with (d) the saturated or unsaturated polybasic acid anhydride; and

(13) a carboxyl group-containing photosensitive resin obtained by reacting a reaction product obtained by reacting a reaction product of a novolac-type phenol resin, and an alkylene oxide such as ethylene oxide, propylene oxide, butylene oxide, trimethylene oxide, tetrahydrofuran, tetrahydropyran and/or a cyclic carbonate such as ethylene carbonate, propylene carbonate, butylene carbonate, and 2,3-carbonate propylmethacrylate with (h) an unsaturated monocarboxylic acid, and then reacting the resultant product with (d) the saturated or unsaturated polybasic acid anhydride.

Among the above-described components, when the isocyanate group-containing compound used for the synthesis of the resin is a diisocyanate not including a benzene ring in (7) to (10), and when the polyfunctional or bifunctional epoxy resin used for the synthesis of the resin is a compound in a linear structure having a bisphenol A framework, a bisphenol F framework, a biphenyl framework, or a bixylenol framework, or a hydrogenated compound thereof in (5) and (8), components preferably usable as the acid-modified oligomer in view of flexibility of the DFSR may be obtained. In addition, in another aspect, the modified products of the resins (7) to (10) that contain a urethane bond in the main chain thereof are preferred in view of warpage.

Furthermore, as the acid-modified oligomer, commercially available components may be used, and specific examples thereof may include ZAR-2000, CCR-1235, ZFR-1122 and CCR-1291H (Nippon Kayaku, Co., Ltd.).

More specific examples of the acid-modified oligomer include an epoxy (meth)acrylate-based compound. The epoxy (meth)acrylate-based compound refers to a reaction product between 1) an epoxy compound or a polyepoxy compound, and 2) a (meth)acrylate-based compound or a hydroxy (meth)acrylate-based compound.

As the epoxy (meth)acrylate-based compound is used, the flexibility and the like of the DFSF can be sufficiently secured, and a DFSF which exhibits a lower coefficient of thermal expansion and improved heat resistance reliability, and can be preferably used as a package substrate material for a semiconductor device, may be provided.

As the epoxy (meth)acrylate-based compound, an epoxy (meth)acrylate compound derived from cresol novolac or an epoxy (meth) acrylate compound derived from bisphenol F may be used. Further, the epoxy (meth) acrylate-based compound may contain the epoxy (meth)acrylate compound derived from cresol novolac and the epoxy (meth)acrylate compound derived from bisphenol F in a weight ratio of 4:1 to 1:1, or in a weight ratio of 3:1 to 2:1.

The epoxy (meth) acrylate-based compound may have a weight average molecular weight of 5,000 to 50,000, or 6,000 to 20,000. If the weight average molecular weight of the epoxy (meth)acrylate-based compound is too high, the ratio of photo-curable acrylate may be relatively decreased, which may result in the deterioration of the developing properties or strength of the DFSR. If the weight average molecular weight of the epoxy (meth)acrylate-based compound is too low, precipitation or aggregation of the filler particles may occur during the dispersion of the inorganic filler, and the resin composition of one embodiment may be excessively developed.

The acid-modified oligomer may be included in the amount of 5 to 75% by weight, or 10 to 50% by weight, based on the total weight of the resin composition of one embodiment. In addition, optionally, the photo-curable and heat-curable resin composition may include the acid-modified oligomer and the second acid-modified oligomer including the carboxyl group and photo-curable unsaturated functional group in an amount of 5 to 75% by weight, or 10 to 50% by weight. If the content of the acid-modified oligomer is too low, the developing property of the resin composition may decrease and the strength of DFSR may reduce. On the contrary, if the content of the acid-modified oligomer is too high, not only may the resin composition be excessively developed, but the uniformity during coating may decrease.

Furthermore, the acid value of the acid-modified oligomer may be about 40 to 120 mgKOH/g, or about 50 to 150 mgKOH/g, or about 60 to 120 mgKOH/g. If the acid value is too low, the alkali-developing property may decrease, and conversely, if it is too high, it may be difficult to form a normal pattern of DFSR because even the photo-cured part, for example the light exposed part, may be dissolved.

Photopolymerizable Monomer

On the other hand, the resin composition of one embodiment includes a photopolymerizable monomer. Such a photopolymerizable monomer, for example, may be a compound having two or more photo-curable unsaturated functional groups such as polyfunctional vinyl group and the like, and it may form a cross-linked bond with the unsaturated functional group of the acid-modified oligomer to form a cross-linked structure by photo-curing when exposed to light. Therefore, the resin composition of the exposure part corresponding to a portion in which the DFSR is formed may not be alkaline-developed but may remain on the substrate.

The photopolymerizable monomer which is in a liquid phase at room temperature may be used, and therefore, may serve to control viscosity of the resin composition according to a coating method, or to more improve the alkaline development property of a non-exposure part.

As the photopolymerizable monomer, a (meth)acrylate-based compound having two or more photo-curable unsaturated functional groups may be used.

More specific examples include one or more compounds selected from the group consisting of a hydroxyl group-containing acrylate-based compound such as 2-hydroxyethyl acrylate, 2-hydroxypropyl acrylate, pentaerythritol triacrylate, dipentaerythritol pentaacrylate, etc.; a water-soluble acrylate-based compound such as polyethylene glycol diacrylate, polypropylene glycol diacrylate, etc.; a polyfunctional polyesteracrylate-based compound of a polyhydric alcohol such as trimethylolpropane triacrylate, pentaerythritol tetraacrylate, dipentaerythritol hexaacrylate, etc.; an acrylate-based compound of an ethylene oxide adduct and/or a propylene oxide adduct of a polyfunctional alcohol such as trimethylol propane, hydrogenated bisphenol A, etc., or a polyphenol such as bisphenol A, biphenol, etc.; a polyfunctional or monofunctional polyurethane acrylate-based compound which is an isocyanate adduct of the hydroxyl group-containing acrylate-based compound; an epoxyacrylate-based compound which is a (meth)acrylic acid adduct of bisphenol A diglycidylether, hydrogenated bisphenol A diglycidylether, or phenol novolac epoxy resin; a caprolactone-modified acrylate-based compound such as caprolactone-modified ditrimethylolpropane tetraacrylate, an acrylate of ε-caprolactone-modified dipentaerythritol, a caprolactone-modified hydroxyl pivalic acid neopentylglycolester diacrylate, etc.; and a photosensitive (meth)acrylate-based compound of a (meth)acrylate-based compound corresponding to the above-described acrylate-based compounds, and they may be used alone or in combination of two or more thereof.

Among them, as the photopolymerizable monomer, a polyfunctional (meth)acrylate-based compound having two or more (meth)acryloyl groups in a molecule may be preferably used. In particular, pentaerythritol triacrylate, trimethylolpropane triacrylate, dipentaerythritol hexaacrylate, caprolactone-modified ditrimethylolpropane tetraacrylate, or the like may be appropriately used. Examples of a commercially available photopolymerizable monomer includes DPEA-12(KAYARAD), etc.

The photopolymerizable monomer may be included in an amount of 1 to 30% by weight, or 2 to 20% by weight, based on the total weight of the resin composition. If the content of the photopolymerizable monomer is too low, the photo-curing may be insufficient, and if the content is too high, the DFSR may be insufficiently dried, and physical properties may be deteriorated.

Photo-Initiator

The resin composition of one embodiment includes a photo-initiator. Such a photo-initiator, for example, plays a role of initiating a radical photo-curing between the acid-modified oligomer and photopolymerizable monomer at the light exposed part of the resin composition.

As the photo-initiator, any known material can be used, and for example, a benzoin-based compound such as benzoin, benzoinmethylether, benzoinethylether, and the like and an alkylester thereof; an acetophenone-based compound such as acetophenone, 2,2-dimethoxy-2-phenylacetophenone, 1,1-dichloroacetophenone, 4-(1-t-butyldioxy-1-methylethyl)acetophenone, and the like; an anthraquinone-based compound such as 2-methylanthraquinone, 2-amylanthraquinone, 2-t-butylanthraquinone, 1-chloroanthraquinone, and the like; a thioxanthone-based compound such as 2,4-dimethylthioxanthone, 2,4-diisopropylthioxanthone, 2-chlorothioxanthone, and the like; a ketal-based compound such as acetophenonedimethylketal, benzyldimethylketal, and the like; and a benzophenone-based compound such as benzophenone, 4-(1-t-butyldioxy-1-methyl-ethyl)benzophenone, 3,3',4,4'-tetrakis(t-butyldioxycarbonyl) benzophenone, and the like may be used.

Further, an α-amino acetophenone-based compound such as 2-methyl-1-[4-(methylthio)phenyl]-2-morpholinopropanone-1,2-benzyl-2-dimethylamino-1-(4-morpholinophenyl)-butane-1-on, 2-(dimethylamino)-2-[(4-methylphenyl)methyl]-1-[4-(4-morpholinyl)phenyl]-1-butanone, N,N-dimethylaminoacetophenone (as commercially available products, Irgacure (registered trade mark) 907, Irgacure 369, Irgacure 379, etc.), commercially available from Chiba Specialty Chemicals Co., Ltd. (present Chiba Japan Co., Ltd.); and an acylphosphineoxide-based compound such as 2,4,6-trimethylbenzoyldiphenylphosphineoxide, bis(2,4,6-trimethylbenzoyl)-phenylphosphineoxide, bis(2,6-dimethoxybenzoyl)-2,4,4-trimethyl-pentylphosphineoxide (as commercially available products, Lucirin (registered trade mark) TPO commercially available from BASF Co., Ltd., Irgacure 819 commercially available from Chiba Specialty Chemicals Co., Ltd. may be mentioned as a preferable photo-initiator.

Furthermore, as other preferable photo-initiator, an oximeester-based compound may be included. Specific examples of the oximeester-based compound include 2-(acetyloxyiminomethyl)thioxanthene-9-on, (1,2-octane-dion, 1-[4-(phenylthio)phenyl]-,2-(O-benzoyloxime)), (ethanone,1-[9-ethyl-6-(2-methylbenzoyl)-9H-carbazole-3-yl]-,1-(O-acetyloxime)), and the like. As commercially available products, GGI-325, Irgacure OXE01, and Irgacure OXE02 from Chiba Specialty Chemicals Co., Ltd., N-1919 from ADEKA Co., Ltd., and Darocur TPO commercially available from Chiba Specialty Chemicals Co., Ltd. may be included.

The content of the photo-initiator may be about 0.5 to 20% by weight, or about 1 to 10% by weight, or about 1 to 5% by weight based on the total weight of the resin composition. If the content of the photo-initiator is too low, the photo-curing may not occur properly, and conversely, if the content is too high, the resolution of the resin composition may be deteriorated or the DFSR may have insufficient reliability.

Heat-Curable Binder

The resin composition of one embodiment includes a heat-curable binder having heat-curable functional group, for example, one or more selected from an epoxy group, an oxetanyl group, a cyclic ether group and cyclic thioether group. Such a heat-curable binder may form a cross-linked bond with the acid-modified oligomer and the like by heat-curing to assure heat resistance or mechanical properties of the DFSR. In addition, the heat-curable binder is not limited to its type, and a material that is well known in the art may be used.

As the heat-curable binder, a resin having two or more cyclic ether groups and/or cyclic thioether groups (hereinafter, referred to as cyclic (thio)ether groups) in a molecule may be used, and a bifunctional epoxy resin may be used. Other diisocyanate or bifunctional blocked isocyanate thereof may also be used.

The heat-curable binder having two or more cyclic (thio)ether groups in a molecule may be a compound having two or more of any one kind or two kinds selected from a 3-, 4-, or 5-membered cyclic ether group or cyclic thioether group in a molecule. Furthermore, the heat-curable binder may be a polyfunctional epoxy compound having two or more epoxy groups in a molecule, a polyfunctional oxetane compound having at least two oxetanyl groups in a molecule, or an episulfide resin having at least two thioether groups in a molecule, etc.

Specific examples of the polyfunctional epoxy compound may include a bisphenol A-type epoxy resin, a hydrogenated bisphenol A-type epoxy resin, a brominated bisphenol A-type epoxy resin, a bisphenol F-type epoxy resin, a bisphenol S-type epoxy resin, a novolac-type epoxy resin, a phenol novolac-type epoxy resin, a cresol novolac-type epoxy resin, an N-glycidyl-type epoxy resin, a novolac-type epoxy resin of bisphenol A, a bixylenol-type epoxy resin, a biphenol-type epoxy resin, a chelate-type epoxy resin, a glyoxal-type epoxy resin, an amino group-containing epoxy resin, a rubber-modified epoxy resin, a dicyclopentadiene phenolic-type epoxy resin, a diglycidylphthalate resin, a heterocyclic epoxy resin, a tetraglycidylxylenoylethane resin, a silicon-modified epoxy resin, a ε-caprolactone-modified epoxy resin, and the like. In addition, in order to provide flame retardance, a compound having a structure into which atoms such as phosphorus, and the like, are introduced may be used. These epoxy resins improve characteristics such as the adhesion property, solder heat resistance, and electroless plating resistance of a cured film through the heat-curing process.

Examples of the polyfunctional oxetane compound may include the polyfunctional oxetanes such as bis[(3-methyl-3-oxetanylmethoxy)methyl]ether, bis[(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl)methylacrylate, (3-ethyl-3-oxetanyl)methylacrylate, (3-methyl-3-oxetanyl)methylmethacrylate, (3-ethyl-3-oxetanyl)methylmethacrylate, and oligomers or copolymers thereof, and may also include an esterified product of an oxetane alcohol and a resin having a hydroxyl group such as a novolac resin, poly(p-hydroxystyrene), cardo-type bisphenols, calix arenes, calix resorcinarenes, silsesquioxanes, and the like. In addition, a copolymer of an unsaturated monomer having an oxetane ring and an alkyl(meth)acrylate may be included.

Examples of the compound having two or more cyclic thioether groups in a molecule may include a bisphenol A-type episulfide resin (YL700) produced by Japan Epoxy Resin Co., Ltd. Further, an episulfide resin in which the oxygen atom of epoxy group of novolac epoxy resin is substituted with sulfur atom may be used.

Furthermore, another one that is commercially available is YDCN-500-80P produced by Kukdo Chemical Co., Ltd.

The heat-curable binder may be included in an amount corresponding to 0.5 to 2.0 equivalents per 1 equivalent of the carboxyl group of the acid-modified oligomer. For example, the photo-curable and heat-curable resin binder may include the heat-curable binder in an amount of 0.1 to 30% by weight, or 0.1 to 10% by weight. If the content of the heat-curable binder is too low, the carboxyl group remains in the DFSR after being cured and thus the heat resistance, alkali resistance, electrical insulation, and the like may be deteriorated. On the contrary, if the content is too high, it is not preferable because of the low molecular weight cyclic (thio)ether groups remaining on the dried coating film, thereby decreasing the film strength.

Plate-Like Inorganic Filler

The Young's modulus expressed by the following equation is considered in terms of the high elastic modulus in the dry film type solder resist.

$$E = \frac{\text{tensile stress}}{\text{extensional strain}} = \frac{\sigma}{\varepsilon} = \frac{F/A_0}{\Delta L/L_0} = \frac{FL_0}{A_0 \Delta L} \quad \text{[Equation 1]}$$

In Equation 1, E is the Young's modulus, F is the force applied to the material under tension, $A_0$ is the original cross-sectional area to which the force is applied, $\Delta L$ is the length variation of the material, and $L_0$ is the original length of the material.

In addition, in order to provide a high modulus of elasticity, it is desirable that the modulus (E$\alpha$) of the filler itself is high in the resin composition and the solder resist. Further, it is advantageous for the filler to be highly filled with a small particle size and to have a shape where the surface area is maximized. Specifically, in the shape of the filler, the aspect ratio increases from the shape of a sphere, a cube, and a plate, and the plate-like filler is preferably used to maximize the contact area of the resin-filler.

Based on these points, the present invention is characterized by using a plate-like inorganic filler having a high modulus and a specific physical property.

Preferably, the E-modulus of the plate-like inorganic filler may be 90 to 120 (Gpa). In addition, it is preferable for the plate-like inorganic filler to use a talc powder having a specific property such as a high E-modulus described above.

More preferably, the plate-like inorganic filler may include a plate-like talc powder having whiteness of 90% or higher, a particle size (D50) of 0.5 to 2 µm, a top size of 3 to 10 µm, a water content of 0.3 to 1% measured by JIS-K5101, an apparent density of 0.07 to 0.2 g/ml, and a specific surface area of 17 to 30 m$^2$/g measured by the BET method.

Most preferably, the plate-like inorganic filler may include a plate-like talc powder having whiteness of 96% or higher, a particle size (D50) of 0.6 to 1.5 µm, a top size of 4 to 7 µm, a water content of 0.5 to 0.7% measured by JIS-K5101, an apparent density of 0.09 to 0.1 g/ml, and a specific surface area of 18 to 24 m$^2$/g measured by the BET method.

Herein, when the physical properties of the inorganic filler are not satisfied, for example, if the particle size of the inorganic filler is less than 0.6 µm, the specific surface area is relatively increased, and the contact area between the resin and filler becomes too large, thereby causing a problem of decreasing the adhesion between the dry film and PCB substrate. On the contrary, if the particle size of the inorganic filler exceeds 2 µm, this may adversely affect the formation of fine patterns.

The plate-like filler plays a role of improving the heat-resistant stability, the dimensional stability to heat, and the adhesive force of the resin. It also acts as a body pigment by reinforcing the color.

In addition, inorganic or organic fillers may be further used in the present invention as needed, and for example barium sulfate, barium titanate, amorphous silica, crystalline silica, fused silica, spherical silica, talc, clay, magnesium carbonate, calcium carbonate, aluminum oxide (alumina), aluminum hydroxide, mica, and the like may be used.

Further, in the present invention, it is preferable that the plate-like inorganic filler is used in an amount corresponding to 20 to 40 vol %, more preferably 30 to 35 vol %, in the solid content of the total resin composition. When the volume percentage of the filler in the solid content of the total resin composition is converted into weight percentage, the following content range can be used.

That is, the content of the plate-like filler may be 20 to 60% by weight, or 40 to 55% by weight, or 45 to 55% by weight in the solid content of the total resin composition. When the solid content of the inorganic filler is used in an amount exceeding 60% by weight, the viscosity of the composition increases which may deteriorate the coating property or may decrease the curing degree, which is not preferable. Further, if the solid content thereof is less than 20% by weight, the modulus-improving effect may not be expected, and the developing property and coefficient of thermal expansion may be lowered.

Herein, the solid content of the plate-like inorganic filler in the total resin composition may be calculated in consideration of the components excluding the solvent and volatile components.

In addition, the content of the volume ratio of the plate-like inorganic filler in the total resin composition may be calculated in consideration of the density of each filler and resin.

Dispersant

In addition, in the present invention, by using the plate-like inorganic filler, a fine pattern can be formed even when the inorganic filler is used in an excess amount of 35% by weight or higher based on the solid content weight. However, when only the plate-like inorganic filler is used, the amount thereof must be increased, which may adversely affect the formation of fine patterns.

Accordingly, the present invention is characterized by using a certain amount of dispersant in the resin composition together with the plate-like inorganic filler described above. That is, the dispersant is used for improving the dispersion stability of fillers, pigments, etc., and can easily form a fine pattern.

The dispersant may be used in an appropriate amount considering the dispersibility of each component used in the photosensitive resin composition. For example, the dispersant may be preferably contained in an amount of 1 to 6% by weight based on the total solid content of the resin composition. If the content of the dispersant is excessively low in the amount of less than 1% by weight, the dispersion may be insufficient and it may adversely affect the formation of fine patterns, and if an excessively large amount of dispersant exceeding 6% by weight is added, it may affect the heat resistance and reliability. Therefore, when only the inorganic filler is used without using the dispersant, a fine pattern is not formed even though a certain modulus value is expressed.

Examples of the dispersant used in the present invention include Tyzor AA, AA-65 and AA-105 available from Dorf Ketal, etc.

On the other hand, in addition to the components described above, the resin composition of one embodiment may further include a solvent; and at least one selected from the group consisting of an epoxy curing agent, a heat-curable binder catalyst, a pigment, and an additive disclosed below.

Heat-Curable Binder Catalyst

The heat-curable binder catalyst plays a role of promoting the heat-curing of the heat-curable binder.

As the heat-curable binder catalyst, for example, an imidazole derivative such as imidazole, 2-methyl imidazole, 2-ethyl imidazole, 2-ethyl-4-methyl imidazole, 2-phenyl imidazole, 4-phenyl imidazole, 1-cyanoethyl-2-phenyl imidazole, 1-(2-cyanoethyl)-2-ethyl-4-methyl imidazole, and the like; an amine compound such as dicyandiamide, benzyldimethyl amine, 4-(dimethylamino)-N,N-dimethylbenzyl amine, 4-methoxy-N,N-dimethylbenzyl amine, 4-methyl-N,N-dimethylbenzyl amine, and the like; a hydrazine compound such as adipic acid dihydrazide, sebacic acid dihydrazide, and the like; and a phosphorous compound such as triphenyl phosphine and the like may be used.

Further, as a commercially available product, for example, 2MZ-A, 2MZ-OK, 2PHZ, 2P4BHZ, and 2P4MHZ (all of which are product names of imidazole-based compounds) produced by Shikoku Kasei Kogyo Co., Ltd., U-CAT3503N and UCAT3502T (all of which are product names of blocked isocyanate compounds of dimethylamine), and DBU, DBN, U-CATSA102, and U-CAT5002 (all of which are product names of bicyclic amidine compounds and their salts) produced by San Apro Co., Ltd., may be used.

Particularly, it may be, but is not limited thereto, a heat-curing catalyst for an epoxy resin or an oxetane compound, or a catalyst for promoting the reaction of an epoxy resin and/or an oxetane compound and a carboxyl group, and it may be used alone or in combination of two or more thereof. Furthermore, guanamine, acetoguanamine, benzoguanamine, melamine, and a S-triazine derivative such as 2,4-diamino-6-methacryloyloxyethyl-S-triazine, 2-vinyl-4,6-diamino-S-triazine, 2-vinyl-4,6-diamino-S-triazine.isocyanuric acid adduct, 2,4-diamino-6-methacryloyloxyethyl-S-triazine.isocyanuric acid adduct, and the like may be used, and preferably a compound functioning as an adhesion promoter may be used in combination with the heat-curable binder catalyst.

The content of the heat-curable binder catalyst may be about 0.3 to 2% by weight based on the total solid content of the resin composition, in the aspect of proper heat-curing property.

Pigment

The pigment plays a role of hiding defects such as scratches of the circuit lines by exhibiting visibility and hiding power.

As the pigment, red, blue, green, yellow, and black pigments may be used. As the blue pigment, phthalocyanine blue, pigment blue 15:1, pigment blue 15:2, pigment blue 15:3, pigment blue 15:4, pigment blue 15:6, pigment blue 60, and the like may be used. As the green pigment, pigment green 7, pigment green 36, solvent green 3, solvent green 5, solvent green 20, solvent green 28, and the like may be used. As the yellow pigment, anthraquinone-based compounds, isoindolinone-based compounds, condensed azo-based compounds, benzimidazolone-based compounds, and the like may be used, and for example, pigment yellow 108, pigment yellow 147, pigment yellow 151, pigment yellow 166, pigment yellow 181, pigment yellow 193, and the like may be used.

The content of the pigment is preferably used in an amount of about 0.5 to 3% by weight based on the total weight of the resin composition. When the pigment is used at less than about 0.5% by weight, the visibility and hiding power may decrease, and when the pigment is used exceeding about 3% by weight, the heat-resistance may decrease.

Additive

An additive may be included for eliminating bubbles in the resin composition, eliminating popping or craters on the surface during a film coating process, imparting a flame retardant property, controlling viscosity, or playing a role of a catalyst.

Specifically, a well-known additive including a well-known thickener such as micronized silica, organic bentonite, montmorillonite, and the like; a silicon-based, fluoro-based, or polymer-based antifoaming agent and/or leveling agent; an imidazole-based, thiazole-based, or triazole-based silane coupling agent; a flame retardant such as a phosphorus-based flame retardant, an antimony-based flame retardant, and the like may be included therein. Among them, the leveling agent plays a role of eliminating popping or craters on the surface during film coating process, and for example, BYK-380N, BYK-307, BYK-378, BYK-350, and the like produced by BYK-Chemie GmbH may be used.

The content of the additive is preferably about 0.01 to 10% by weight based on the total weight of the resin composition.

Solvent

One or more solvents may be used by mixing them together in order to dissolve the resin composition or impart proper viscosity.

As the solvent, ketones such as methylethylketone, cyclohexanone, and the like; aromatic hydrocarbons such as toluene, xylene, tetramethylbenzene, and the like; glycol ethers (cellosolves) such as ethyleneglycol monoethylether, ethyleneglycol monomethylether, ethyleneglycol monobutylether, diethyleneglycol monoethylether, diethyleneglycol monomethylether, diethyleneglycol monobutylether, propyleneglycol monomethylether, propyleneglycol monoethylether, dipropyleneglycol diethylether, triethyleneglycol monoethylether, and the like; acetic acid esters such as ethyl acetate, butyl acetate, ethyleneglycol monoethylether acetate, ethyleneglycol monobutylether acetate, diethyleneglycol monoethylether acetate, diethyleneglycol monobutylether acetate, propyleneglycol monomethylether acetate, dipropyleneglycol monomethylether acetate, and the like; alcohols such as ethanol, propanol, ethylene glycol, propylene glycol, carbitol, and the like; aliphatic hydrocarbons such as octane, decane, and the like; petroleum-based solvents such as petroleum ether, petroleum naphtha, hydrogenated petroleum naphtha, solvent naphtha, and the like; and amides such as dimethyl acetamide, dimethylformamide (DMF), and the like may be used. These solvents may be used alone or in a mixture of two or more thereof.

The content of the solvent may be about 1 to 50% by weight based on the total weight of the resin composition.

When the content is less than 1% by weight, the viscosity may be too high and thus the coating property may decrease, and when the content exceeds 50% by weight, the drying may not be performed properly and the tackiness may increase.

On the other hand, according to another embodiment of the present invention, there may be provided a dry film solder resist which includes a cured product of an acid-modified oligomer having a photo-curable functional group having an acrylate group or an unsaturated double bond, and a carboxyl group in the molecule; a photopolymerizable monomer having at least two photo-curable unsaturated functional groups; and a heat-curable binder having a heat-curable functional group, and a plate-like inorganic filler having an E-modulus of 90 to 120 (Gpa) which is dispersed in the cured product.

The process of preparing the dry film solder resist (DFSR) by using the photo-curable and heat-curable resin composition according to one embodiment is briefly explained as follows.

First, the resin composition according to one embodiment is coated as a photo-sensitive coating material on a carrier film with a comma coater, a blade coater, a lip coater, a rod coater, a squeeze coater, a reverse coater, a transfer roll coater, a gravure coater, or a spray coater, etc., and dried by passing the film through an oven at 50 to 130° C. for 1 to 30 minutes, and then a release film is laminated thereon so as to prepare a dry film composed of a carrier film, a photo-sensitive film, and a release film sequentially from the bottom.

The thickness of the photo-sensitive film may be 5 to 100 µm. Herein, a plastic film such as a polyethylene terephthalate (PET) film, a polyester film, a polyimide film, a polyamideimide film, a polypropylene film, a polystyrene film, etc. may be used as the carrier film, and a polyethylene (PE) film, a polytetrafluoroethylene film, a polypropylene film, surface treated paper, etc. may be used as the release film. It is preferable that the adhesive force between the photo-sensitive film and the release film is lower than the adhesive force between the photo-sensitive film and the carrier film when the release film is peeled off.

Next, after peeling off the release film, the photo-sensitive film layer is adhered to a board on which a circuit is formed by using a vacuum laminator, a hot-roll laminator, a vacuum press, etc.

Then, the substrate is exposed to light (UV, etc.) having a certain wavelength. The exposure process is selectively performed through a photomask, or through direct pattern exposure using a direct laser exposer. The carrier film is peeled off after the exposure to light. The amount of exposure may be different depending on the thickness of the film, but may preferably be 0 to 1000 mJ/cm$^2$. By carrying out the light exposure, for example, photo-curing occurs at the light exposed part to form a crosslink between the unsaturated functional groups included in the acid-modified oligomer and the photopolymerizable monomer, etc., and consequently the light exposed part may remain without being eliminated after the developing process.

On the contrary, the crosslink and the subsequent cross-linked structure are not formed in the non-light exposed part, and the carboxy group is maintained as it is, and thus can be alkali-developed.

Thereafter, a development process is carried out by using an alkali solution. As the alkali solution, an aqueous alkali solution including potassium hydroxide, sodium hydroxide, sodium carbonate, potassium carbonate, sodium phosphate, sodium silicate, ammonia, amines, etc. may be used. According to the development, only the light exposed part of the film can remain.

Finally, a printed circuit board including the solder resist formed from the photo-sensitive film is completed by the process of heat-curing (post curing). The heat-curing temperature may preferably be 100° C. or higher.

According to the above-described method, the DFSR and the printed circuit board including the same may be provided. As the DFSR undergoes photo-curing and heat-curing processes, it may include a cured product of an acid-modified oligomer having a carboxy group and a photo-curable unsaturated functional group; a photopolymerizable monomer having two or more photo-curable unsaturated functional groups; and a heat-curable binder having a heat-curable functional group. Further, the dry film solder resist may include a plate-like inorganic filler which is dispersed in the cured product and has the specific physical properties described above.

More specifically, the cured product may include a cross-linked structure in which a photo-curable functional group of the acid-modified oligomer and a heat-curable functional group of the heat-curable binder are cross-linked; a cross-linked structure in which a photo-curable functional group of the acid-modified oligomer and an unsaturated functional group of the photopolymerizable monomer are cross-linked; and a cross-linked structure derived from the acid-modified oligomer.

Further, as the photo-curable and heat-curable resin composition for preparing the dry film solder resist of the embodiment further includes a second acid-modified oligomer containing a carboxyl group and a photo-curable unsaturated functional group, the cured product included in the DFSR may include a cured product of an acid-modified oligomer having a carboxyl group and a photo-curable unsaturated functional group; a photopolymerizable monomer having at least two photo-curable unsaturated functional groups; and a heat-curable binder having a heat-curable functional group.

The dry film solder resist of the embodiment contains a cross-linked product including a triazine cross-linked structure and minimizes the amount of other residual compounds, thereby securing a higher developing property, and accordingly, a fine pitch may be easily implemented.

Furthermore, the present invention may include a certain amount of plate-like inorganic filler having a high modulus and exhibiting specific properties, thereby lowering the coefficient of thermal expansion and improving the Young's modulus. In particular, the present invention may include a certain amount of dispersant together with the inorganic filler, thereby enabling the formation of a fine pattern and implementing a high modulus.

Accordingly, the dry film solder resist may have a coefficient of thermal expansion of less than 40 ppm/K, and more preferably it may have a coefficient of thermal expansion of 15 to 30 ppm/K.

Further, the dry film solder resist may have a Young's modulus of 4 to 12 Gpa. Preferably, the dry film solder resist may have a Young's modulus of 7 to 10 Gpa.

Further, the DFSR may have a glass transition temperature of about 120 to 180° C., for example, about 140 to 170° C., and may show more improved heat resistance reliability. Accordingly, the DFSR may satisfy various physical properties such as excellent PCT resistance, TCT heat resistance, HAST tolerance to fine wiring, etc. that are required for a package board material of a semiconductor device, and thus can be preferably used as the package board material of the semiconductor device.

In addition, the DFSR may further include a small quantity of the photo-initiator remain after the photo-curing process in a state of being dispersed in the cured product.

As described above, as the dry film solder resist according to the present invention includes the plate-like inorganic filler dispersed in the cured product, it has effects of improving the modulus and lowering the CTE, and can maintain a high level of adhesive force with respect to a commonly-used board while sufficiently ensuring the hardness of the DFSR prepared above.

Moreover, the DFSR may include a form in which a common inorganic filler is further dispersed, as needed.

The plate-like inorganic filler may include a plate-like talc powder having whiteness of 90% or higher, a particle size (D50) of 0.5 to 2 μm, a top size of 3 to 10 μm, a water content of 0.3 to 1% measured by JIS-K5101, an apparent density of 0.07 to 0.2 g/ml, and a specific surface area of 17 to 30 m$^2$/g measured by the BET method.

More preferably, the plate-like inorganic filler may include a plate-like talc powder having whiteness of 96% or higher, a particle size (D50) of 0.6 to 1.5 μm, a top size of 4 to 7 μm, a water content of 0.5 to 0.7% measured by JIS-K5101, an apparent density of 0.09 to 0.1 g/ml, and a specific surface area of 18 to 24 m$^2$/g measured by the BET method.

The dry film solder resist of the embodiment may include the plate-like inorganic filler having the above physical properties in an amount of 20 to 60% by weight, more preferably 40 to 55% by weight, or 45 to 55% by weight of the solid content of the solder resist. If the solid content of the inorganic filler in the solder resist is too low, the hardness and stiffness of the DFSR may not be sufficiently secured, thereby decreasing the workability, and the effect according to the addition of the inorganic filler may not be fully manifested. Further, if the solid content of the inorganic filler is too high, the inorganic filler may not be uniformly dispersed in the DFSR, and the elongation percentage of the dry film solder resist, etc. may decrease.

Specific details with respect to the components that can be included in the dry film solder resist are included in the details with respect to the photo-curable and heat-curable resin composition of one embodiment.

Hereinafter, the present invention will be described in more detail with reference to Examples. However, the Examples are only for illustrative purposes, and the scope of the present invention is not intended to be limited by these Examples.

EXAMPLES AND COMPARATIVE EXAMPLES: PREPARATION OF RESIN COMPOSITION, DRY FILM AND PRINTED CIRCUIT BOARD

Example 1

The resin composition was prepared by mixing 45 g of CCR-1171H and 15 g of ZAR-2000 (Nippon Kayaku Co., Ltd.) as the acid-modified oligomers, 5 g of DPHA as the photopolymerizable monomer, 4 g of TPO as the photoinitiator, 18 g of YDCN-500-80P (Nippon Kayaku Co., Ltd.) as the heat-curable binder, 1 g of 2-PI as the heat-curable binder catalyst, 68 g of talc (NANO ACE D-800) (Nippon Talc Co., Ltd.) having a particle size (D50) of 0.8 μm as the plate-like inorganic filler, 0.5 g of phthalocyanine blue and 0.5 g of Y147 as the pigment, 4 g of Tyzor AA as the dispersant, and 50 g of DMF solvent. Herein, the E-modulus of NANO ACE D-800, the plate-like talc, was 115 Gpa.

The resin composition thus prepared was coated on a PET film as the carrier film, dried by passing it through an oven at 100° C., and then a PE film as the release film was laminated thereon, thereby producing a dry film composed of a carrier film, a photo-sensitive film (thickness of 20 μm), and a release film sequentially from the bottom.

After peeling off the cover film of the prepared dry film, the photo-sensitive film layer was vacuum laminated on the board on which the circuit was formed, and the photomask corresponding to the circuit pattern was placed on the photo-sensitive film layer, which was then exposed to UV. The exposure was performed under UV light of 365 nm wavelength at 400 mJ/cm$^2$. Thereafter, the PET film was removed, and the unnecessary part was also removed by developing for a certain period of time in 1 wt % Na$_2$CO$_3$ alkali solution at 31° C. to form the desired pattern. Subsequently, the photo-curing was performed at 1500 mJ/cm$^2$, and finally the heat-curing was performed for 1 h at 160 to 170° C. to prepare a printed circuit board including the protective film (solder resist) formed from the photo-sensitive film

Example 2

Dry films and printed circuit boards were prepared according to the same procedure as Example 1, except that 68 g of NANO ACE D-1000 (Nippon Talc Co., Ltd.) having a particle size (D50) of 1.0 μm was used as the plate-like inorganic filler by modifying the type thereof.

Herein, the E-modulus of NANO ACE D-1000, the plate-like talc, was 120 Gpa.

Example 3

Dry films and printed circuit boards were prepared according to the same procedure as Example 1, except that 86 g of NANO ACE D-1000 (Nippon Talc Co., Ltd.) having a particle size (D50) of 1.0 μm was used as the plate-like inorganic filler by modifying the content thereof. Herein, the E-modulus of NANO ACE D-1000, the plate-like talc, was 120 Gpa. The specific compositions of the resin compositions of Examples 1 to 3 are summarized in Table 1 below.

TABLE 1

| | Components | Solid content of component itself (wt %) | Example 1 a | Example 1 b | Example 2 a | Example 2 b | Example 3 a | Example 3 b |
|---|---|---|---|---|---|---|---|---|
| A | CCR-1171H | 65 | 45 | 29.25 | 45 | 29.25 | 45 | 29.25 |
| | ZAR-2000 | 65 | 15 | 9.75 | 15 | 9.75 | 15 | 9.75 |
| B | DPHA | 100 | 5 | 5 | 5 | 5 | 5 | 5 |
| C | YDCN-500-80P | 100 | 18 | 18 | 18 | 18 | 18 | 18 |
| D | TPO | 100 | 4 | 4 | 4 | 4 | 4 | 4 |
| E | 2-PI | 100 | 1 | 1 | 1 | 1 | 1 | 1 |
| F | NANO ACE D-800 | 100 | 68 | 68 | 0 | 0 | 0 | 0 |
| | NANO ACE D-1000 | 100 | 0 | 0 | 68 | 68 | 86 | 86 |
| G | Phthalocyanine blue (B15:3) | 100 | 0.5 | 0.5 | 0.5 | 0.5 | 0.5 | 0.5 |
| | Y147 | 100 | 0.5 | 0.5 | 0.5 | 0.5 | 0.5 | 0.5 |
| H | Tyzor AA | 75 | 4 | 3 | 4 | 3 | 4 | 3 |
| I | DMF | 0 | 50 | 0 | 50 | 0 | 50 | 0 |
| | Total | | 211 | 139 | 211 | 139 | 229 | 157 |
| | Filler weight in solid content (g) | | | 68 | | 68 | | 86 |
| | Resin weight in solid content (g) | | | 71 | | 71 | | 71 |
| | Filler weight in solid content (wt %) | | | 48.9 | | 48.9 | | 54.8 |
| | Resin weight in solid content (wt %) | | | 51.1 | | 51.1 | | 45.2 |
| | Filler volume in solid content (ml) | | | 18.1 | | 18.1 | | 20.3 |
| | Resin volume in solid content (ml) | | | 42.6 | | 42.6 | | 37.7 |
| | Filler volume ratio in solid content (vol %) | | | 29.9 | | 29.9 | | 35 |

A: Acid-modified oligomer
B: Photopolymerizable monomer
C: Heat-curable monomer
D: Photo-initiator
E: Catalyst
F: Inorganic filler
G: Pigment
H: Dispersant
I: solvent
a: Component of ingredient (g)
b: Weight of solid content (g)

In Table 1, the solid content of the plate-like inorganic filler in the total resin composition was calculated by considering only the components excluding the solvent and volatile components. Among the components, the non-100% solids are as follows:

The solid content of CCR-1171H was 65 wt %
The solid content of ZAR-2000 was 65 wt %
The solid content of Tyzor AA was 75 wt %.

In addition, the volume ratio of the plate-like inorganic filler in the total resin composition was calculated by considering the density of each filler and resin: (volume=mass/density)

The density of talc (NANO ACE) was 2.7

Assuming a density of 1.2 when only the resin was cured, the volume was obtained by dividing each solid content (g) by the density, and the volume ratio (vol %) was obtained therefrom.

Comparative Example 1

Dry films and printed circuit boards were prepared according to the same procedure as in Example 2, except that the plate-like inorganic filler was not used.

Comparative Example 2

Dry films and printed circuit boards were prepared according to the same procedure as in Example 1, except that the plate-like inorganic filler was not used and 25 g of spherical silica (SFP-120M of Denka) was used.

Comparative Example 3

Dry films and printed circuit boards were prepared according to the same procedure as in Example 1, except that the plate-like inorganic filler was not used and 76 g of spherical silica (SFP-120M of Denka) was used.

Herein, the E-modulus of the spherical silica (SFP-120M of Denka) was 70 Gpa.

Comparative Example 4

Dry films and printed circuit boards were prepared according to the same procedure as in Example 1, except that the plate-like inorganic filler was not used and 174 g of spherical silica (SFP-120M of Denka) was used.

Comparative Example 5

Dry films and printed circuit boards were prepared according to the same procedure as in Example 1, except that the plate-like inorganic filler was used and the plate-like talc (Micro Ace P-3 of Nippon talc Co., Ltd.) having an E-modulus of 120 Gpa (D50 5.0 μm) was used.

The specific compositions of the resin compositions of Comparative Examples 1 to 5 are summarized in Tables 2 and 3 below.

TABLE 2

|   | Components | Solid content of component itself (wt %) | Comparative Example 1 a | Comparative Example 1 b | Comparative Example 2 a | Comparative Example 2 b |
|---|---|---|---|---|---|---|
| A | CCR-1171H | 65 | 45 | 29.25 | 45 | 29.25 |
|   | ZAR-2000 | 65 | 15 | 9.75 | 15 | 9.75 |
| B | DPHA | 100 | 5 | 5 | 5 | 5 |
| C | YDCN-500-80P | 100 | 18 | 18 | 18 | 18 |
| D | TPO | 100 | 4 | 4 | 4 | 4 |
| E | 2-PI | 100 | 1 | 1 | 1 | 1 |
| F | NANO ACE D-800 | 100 | 0 | 0 | 0 | 0 |
|   | NANO ACE D-1000 | 100 | 0 | 0 | 0 | 0 |
|   | Denka SFP-120M | 100 |   | 0 | 25 | 25 |
| G | Phthalocyanine blue(B15:3) | 100 | 0.5 | 0.5 | 0.5 | 0.5 |
|   | Y147 | 100 | 0.5 | 0.5 | 0.5 | 0.5 |
| H | Tyzor AA | 75 | 4 | 3 | 4 | 3 |
| I | DMF | 0 | 50 | 0 | 50 | 0 |
|   | Total |   | 143 | 71 | 168 | 96 |
|   | Filler weight in solid content (g) |   |   | 0 |   | 25 |
|   | Resin weight in solid content (g) |   |   | 71 |   | 71 |
|   | Filler weight in solid content (wt %) |   |   | 0 |   | 26 |
|   | Resin weight in solid content (wt %) |   |   | 100 |   | 74 |
|   | Filler volume in solid content (ml) |   |   | 0 |   | 10.9 |
|   | Resin volume in solid content (ml) |   |   | 83.3 |   | 61.6 |
|   | Filler volume ratio in solid content (vol %) |   |   | 0 |   | 15 |

A: Acid-modified oligomer
B: Photopolymerizable monomer
C: Heat-curable monomer
D: Photo-initiator
E: Catalyst
F: Inorganic filler
G: Pigment
H: Dispersant
I: solvent
a: Component of ingredient(g)
b: Weight of solid content (g)

TABLE 3

|   | Components | Solid content of component itself (wt %) | Comparative Example 3 a | Comparative Example 3 b | Comparative Example 4 a | Comparative Example 4 b | Comparative Example 5 a | Comparative Example 5 b |
|---|---|---|---|---|---|---|---|---|
| A | CCR-1171H | 65 | 45 | 29.25 | 45 | 29.25 | 45 | 29.25 |
|   | ZAR-2000 | 65 | 15 | 9.75 | 15 | 9.75 | 15 | 9.75 |
| B | DPHA | 100 | 5 | 5 | 5 | 5 | 5 | 5 |
| C | YDCN-500-80P | 100 | 18 | 18 | 18 | 18 | 18 | 18 |
| D | TPO | 100 | 4 | 4 | 4 | 4 | 4 | 4 |
| E | 2-PI | 100 | 1 | 1 | 1 | 1 | 1 | 1 |
| F | NANO ACE D-800 | 100 | 0 | 0 | 0 | 0 | 0 | 0 |
|   | NANO ACE D-1000 | 100 | 0 | 0 | 0 | 0 | 0 | 0 |
|   | Micro Ace P-3 | 100 | 0 | 0 | 0 | 0 | 68 | 68 |
|   | Denka SFP-120M | 100 | 76 | 76 | 174 | 1740 | 0 | 0 |
| G | Phthalocyanine blue (B15:3) | 100 | 0.5 | 0.5 | 0.5 | 0.5 | 0.5 | 0.5 |
|   | Y147 | 100 | 0.5 | 0.5 | 0.5 | 0.5 | 0.5 | 0.5 |
| H | Tyzor AA | 75 | 4 | 3 | 4 | 3 | 4 | 3 |
| I | DMF | 0 | 50 | 0 | 50 | 0 | 50 | 0 |
|   | Total |   | 219 | 147 | 317 | 245 | 211 | 139 |
|   | Filler weight in solid content (g) |   |   | 76 |   | 174 |   | 68 |
|   | Resin weight in solid content (g) |   |   | 71 |   | 71 |   | 71 |
|   | Filler weight in solid content (wt %) |   |   | 51.7 |   | 71 |   | 48.9 |
|   | Resin weight in solid content (wt %) |   |   | 48.3 |   | 29 |   | 51.1 |

TABLE 3-continued

|  | Solid content of component itself (wt %) | Comparative Example 3 | | Comparative Example 4 | | Comparative Example 5 | |
|---|---|---|---|---|---|---|---|
| Components | | a | b | a | b | a | b |
| Filler volume in solid content (ml) | | | 21.5 | | 29.6 | | 18.1 |
| Resin volume in solid content (ml) | | | 40.2 | | 24.1 | | 42.6 |
| Resin volume ratio in solid content (vol %) | | | 34.9 | | 55.1 | | 29.9 |

A: Acid-modified oligomer
B: Photopolymerizable monomer
C: Heat-curable monomer
D: Photo-initiator
E: Catalyst
F: Inorganic filler
G: Pigment
H: Dispersant
I: solvent
a: Component of ingredient (g)
b: Weight of solid content (g)

In Tables 2 and 3, the solid content of the plate-like inorganic filler in the total resin composition was calculated by considering only the components excluding the solvent and volatile components. Among the components, the non-100% solids are as follows:

The solid content of CCR-1171H was 65 wt %
The solid content of ZAR-2000 was 65 wt %
The solid content of Tyzor AA was 75 wt %.

In addition, the volume ratio of the plate-like inorganic filler in the total resin composition was calculated by considering the density of each filler and resin: (volume=mass/density)

The density of talc (NANO ACE) was 2.7
The density of silica (SFP-120M) was 2.4

Assuming a density of 1.2 when only the resin was cured, the volume was obtained by dividing each solid content (g) by the density, and the volume ratio (vol %) was obtained therefrom.

EXPERIMENTAL EXAMPLES

The physical properties of the dry films and printed circuit boards prepared in the examples and comparative examples were measured by the following methods:

Experimental Example 1: Measurement of Glass Transition Temperature (Tg)

The film layer was laminated on a 12 μm shiny surface of copper foil 3EC-M3-VLP (Mitsui Metal Co., Ltd.) in the same manner as the preparation of the specimen for measuring the PCT heat resistance or the like. A DFSR specimen was prepared in the same manner as in the preparation of the specimen for measuring the moisture resistance or the like of Experimental Example 1 until the heat-curing step, except that a negative-type mask having a stripe pattern with a width of 5 mm and an interval of 5 mm was placed on the specimen and exposed to light. Finally, the copper foil was peeled from the specimen to give a specimen having a 5 mm stripe shape for the evaluation of TMA (thermal mechanical analysis, METTLER TOLEDO, TMA/SDTA 840).

The glass transition temperature (Tg) was measured by the following method.

First, the specimen was installed in a holder to have the length of 10 mm. The elongated length of the specimen was measured while applying a force of 0.05 N to both ends and raising the temperature at a rate of 5° C./min from −20° C. to 300° C.

The inflection point shown in the temperature raising interval was referred to as Tg, and Tg was evaluated according to the following criteria:
  1: Tg of 150° C. or higher
  2: Tg of 120° C. or higher and below 150° C.;
  3: Tg of 100° C. or higher and below 120° C.;
  4: Tg below 100° C.

Further, the coefficient of thermal expansion (CTE) which was required concurrently with Tg measurement was measured and compared at the same time. First, the coefficient of thermal expansion was obtained by a slope of the elongated specimen from 0° C. to 100° C. The results were evaluated according to the following criteria:
  (Coefficient of Thermal Expansion)
  1: Below 15 ppm/K;
  2: 15 ppm/K or higher and below 20 ppm/K;
  3: 20 ppm/K or higher and below 30 ppm/K;
  4: 30 ppm/K or above.

Experimental Example 2: Evaluation of Developing Property

A copper clad laminate, 3EC-M3-VLP of Mitsui Metal Co., Ltd. having a thickness of 12 μm was cut into length and breadth of 5 cm×5 cm, and micro-roughness was formed on the surface of the copper foil by chemical etching.

The release film of the dry film prepared in the examples and comparative examples was removed, and then the film layer on the copper clad laminate (substrate) on which the roughness was formed was vacuum-laminated by using a vacuum laminator (MV LP-500 produced by Meiki Seisakusho Co., Ltd.).

Then, a negative-type photomask having a hole shape having a diameter ranging from 100 μm to 10 μm in diameter unit of 10 μm was brought into tight contact therewith, and then UV light having a wavelength of 365 nm was exposed in an exposure amount of 400 mJ/cm². Thereafter, the PET film was removed, and the specimen was developed for a certain period of time in 1 wt % $Na_2CO_3$ alkali solution at 31° C. to form a pattern. Then, the pattern shape formed above was observed by SEM and evaluated according to the following criteria.
  1: Can be developed up to a hole diameter of 30 μm or below;
  2: Can be developed up to a hole diameter of 40 to 50 μm;
  3: Can be developed up to a hole diameter of 50 to 60 μm;

4: Can be developed up to a hole diameter of 60 μm or above, or not developed.

Experimental Example 3: Measurement of Dielectric Constant

The dry film solder resist with a size of 15 cm by 15 cm obtained in the examples and comparative examples was laminated on a copper foil with a size of 16 cm by 16 cm.

Then, a DFSR specimen (cured film) was prepared in the same manner as in the preparation of the measurement specimen of the moisture heat resistance or the like of Experimental Example 1 until the heating-curing step, except that the entire surface was exposed at an exposure amount of 400 mJ/cm$^2$ without a photo-mask, followed by etching of only the copper foil.

As for the cured film, a Vector Network Analyzer manufactured by Agilent Technologies was used as a measurement device, and a Split Post Dielectric Resonator manufactured by QWED Corporation was used as a measurement jig, thereby measuring the dielectric constant in the 10 GHz band.

The results measured and evaluated in Experimental Examples 1 to 3 are summarized in Table 4 below.

TABLE 4

|  | Examples ||| Comparative Examples |||||
| --- | --- | --- | --- | --- | --- | --- | --- |
|  | 1 | 2 | 3 | 1 | 2 | 3 | 4 | 5 |
| Tg | 2 | 2 | 2 | 3 | 3 | 4 | 4 | 2 |
| CTE (ppm) | 2 | 2 | 1 | 4 | 4 | 2 | 1 | 2 |
| Development property | 2 | 2 | 2 | 2 | 2 | 4 | 4 | 4 |
| Dielectric constant | 3.5 | 3.5 | 3.5 | 3.2 | 3.5 | 3.5 | 3.5 | 3.4 |

As shown in the measurement and evaluation results of Table 4, it was confirmed that the DFSR of the examples showed greatly improved development property and excellent physical properties compared with those of the comparative examples in various aspects of heat resistance, glass transition temperature, coefficient of thermal expansion, dielectric constant, etc. Therefore, it was confirmed that the examples are appropriate for the formation of the DFSR showing heat resistance reliability at high temperatures.

On the other hand, it can be seen that the physical properties of Comparative Examples 1 to 5 are generally poorer than those of Examples 1 to 3. In addition, it was shown that, in Comparative Example 5, some physical properties were at a similar level to that of the examples, but the development property was insufficient in comparison with the examples. That is, in the case of Comparative Example 5, even if the E-modulus was included in the scope of the present invention, the D50 was 5 μm which was too large, thereby causing a problem of significantly reducing the development property.

Experimental Example 4: Fine Patterns

As for Example 1 and Comparative Examples 1 to 5, the E-modulus and scanning electron microscopic images (SEM) were measured, and the results are shown in FIG. 1.

As shown in FIG. 1, since the filler was not applied in Comparative Example 1, a pattern was formed to some extent, but a fine pattern could not be implemented, and the E-modulus was also low. Further, in Comparative Examples 3 and 4, the E-modulus was at a similar level to that of the present invention, but in Comparative Examples 2 to 4, the spherical filler was applied, and thus a fine pattern could not be implemented. In particular, as can be seen from the SEM image of Comparative Example 5, the pattern itself was not formed.

On the other hand, sit was confirmed that, in the case of Example 1, 68 g (solid content of 48.9 wt %) of the plate-like inorganic filler of about 30 vol % in total solid content and the dispersant were included, thereby allowing the formation of a fine pattern.

Experimental Example 5: Young's Modulus

The Young's modulus of the dry film solder resist with a size of 15 cm by 15 cm obtained in the examples and comparative Examples was measured by a common method. The results of the Young's modulus according to the filler content are shown in FIG. 2.

As shown in FIG. 2, in Comparative Example 1, the filler was not applied and thus showed a very low Young's modulus. In Comparative Examples 2 to 4, the filling content was increased and thus Young's Modulus was increased compared to Comparative Example 1, but the spherical filler was used, resulting in disadvantageous fine pattern formation.

In this case, the Young's modulus of Comparative Example 4 was larger than those of Examples 1 to 3 of the present invention, but as shown in FIG. 1, the formation of a fine pattern was impossible. Further, Comparative Example 5 showed a similar Young's modulus to that of the present invention, but the particle size of the filler was too large, which significantly reduced the development property, and accordingly, the pattern was not formed.

On the other hand, Examples 1 to 3 exhibited generally excellent Young's modulus as compared with Comparative Examples 1 to 5. In particular, since Example 3 used 86 g (solid content of 54.8 wt %) of the plate-like inorganic filler of 35 vol % in total solid content and the dispersant, it was possible to form a fine pattern, and particularly, the Young's modulus reached 10 Gpa.

Experimental Example 6: Evaluation of CTE

The results of Examples 1 to 3 and Comparative Examples 2 to 4 were compared by changing intervals during the measurement of coefficient of thermal expansion. That is, the coefficient of thermal expansion was obtained as a slope of the elongated specimen in the interval from 0° C. to 100° C. Herein, a 13 μm copper foil was used, and the calculation results are shown in FIG. 3.

As shown in FIG. 3, it can be seen that the values of the coefficient of thermal expansion of Examples 1 to 3 using the plate-like inorganic filler and the dispersant in the content range of the present invention are lower than those of Comparative Examples 2 to 4 using a conventional inorganic filler.

The invention claimed is:
1. A photo-curable and heat-curable resin composition including:
   an acid-modified oligomer having a photo-curable functional group having an acrylate group or an unsaturated double bond, and a carboxyl group in a molecule;
   a photopolymerizable monomer having at least two photo-curable unsaturated functional groups;
   a heat-curable binder having a heat-curable functional group;

a plate-like inorganic filler having an E-modulus of 90 to 120 (Gpa);
a dispersant; and
a photo-initiator,
wherein the plate-like inorganic filler comprises a plate-like talc powder having whiteness of 90% or higher, a particle size (D50) of 0.5 to 2 μm, a top size of 3 to 10 μm, a water content of 0.3 to 1% measured by JIS-K5101, an apparent density of 0.07 to 0.2 g/ml, and a specific surface area of 17 to 30 m²/g measured by the BET method.

2. The photo-curable and heat-curable resin composition of claim 1, wherein the plate-like inorganic filler comprises a plate-like talc powder having whiteness of 96% or higher, a particle size (D50) of 0.6 to 1.5 μm, a top size of 4 to 7 μm, a water content of 0.5 to 0.7% measured by JIS-K5101, an apparent density of 0.09 to 0.1 g/ml, and a specific surface area of 18 to 24 m²/g measured by the BET method.

3. The photo-curable and heat-curable resin composition of claim 1, wherein the plate-like inorganic filler is contained in an amount of 20% by weight to 60% by weight of the solid content of the total composition.

4. The photo-curable and heat-curable resin composition of claim 3, wherein the plate-like inorganic filler is contained in an amount of 40% by weight to 55% by weight in the solid content of the total composition.

5. The photo-curable and heat-curable resin composition of claim 1, wherein the dispersant is contained in an amount of 1% by weight to 6% by weight based on the total solid content of the resin composition.

6. The photo-curable and heat-curable resin composition of claim 1, wherein the acid-modified oligomer includes an epoxy (meth)acrylate-based compound.

7. The photo-curable and heat-curable resin composition of claim 1, wherein the acid-modified oligomer is contained in an amount of 5% by weight to 75% by weight based on the total weight of the resin composition.

8. The photo-curable and heat-curable resin composition of claim 1, wherein the photopolymerizable monomer includes an acrylate-based compound having at least two photo-curable unsaturated functional groups.

9. The photo-curable and heat-curable resin composition of claim 1, wherein the photopolymerizable monomer includes at least one compound selected from the group consisting of a hydroxyl group-containing acrylate-based compound, a water-soluble acrylate-based compound, a polyester acrylate-based compound, a polyurethane acrylate-based compound, an epoxy acrylate-based compound and a caprolactone modified-acrylate-based compound.

10. The photo-curable and heat-curable resin composition of claim 1, wherein the photo-initiator is contained in an amount of 0.5% by weight to 20% by weight based on the total weight of the resin composition.

11. The photo-curable and heat-curable resin composition of claim 1, wherein the heat-curable functional group is at least one selected from the group consisting of an epoxy group, an oxetanyl group, a cyclic ether group, and a cyclic thioether group.

12. The photo-curable and heat-curable resin composition of claim 1, wherein the heat-curable binder is contained in an amount corresponding to 0.5 to 2.0 equivalents based on 1 equivalent of a carboxyl group of the acid-modified oligomer.

13. The photo-curable and heat-curable resin composition of claim 1, further including a solvent; and at least one selected from the group consisting of an epoxy curing agent, a heat-curable binder catalyst, a pigment, and an additive.

14. A dry film solder resist including a cured product of an acid-modified oligomer having a photo-curable functional group having an acrylate group or an unsaturated double bond, and a carboxyl group in the molecule; a photopolymerizable monomer having at least two photo-curable unsaturated functional groups; and a heat-curable binder having a heat-curable functional group, and
a plate-like inorganic filler having an E-modulus of 90 to 120 (Gpa) which is dispersed in the cured product.

15. The dry film solder resist of claim 14, including: a cross-linked structure in which a photo-curable functional group of the acid-modified oligomer and a heat-curable functional group of the heat-curable binder are cross-linked; a cross-linked structure in which a photo-curable functional group of the acid-modified oligomer and an unsaturated functional group of the photopolymerizable monomer are cross-linked to each other; and a cross-linked structure derived from the acid-modified oligomer.

16. The dry film solder resist of claim 14, wherein the acid-modified oligomer is an epoxy (meth)acrylate-based compound.

17. The dry film solder resist of claim 14, wherein the dry film solder resist has a coefficient of thermal expansion of less than 40 ppm/K.

18. The dry film solder resist of claim 14, wherein the dry film solder resist has a Young's modulus of 4 to 12 Gpa.

19. The dry film solder resist of claim 14, wherein the plate-like organic filler comprises a plate-like talc powder having whiteness of 90% or higher, a particle size (D50) of 0.5 to 2 μm, a top size of 3 to 10 μm, a water content of 0.3 to 1% measured by JIS-K5101, an apparent density of 0.07 to 0.2 g/ml, and a specific surface area of 15 to 30 m²/g measured by the BET method.

20. The dry film solder resist of claim 14, wherein the plate-like organic filler is contained in an amount of 20% by weight to 60% by weight of the solid content of the solder resist.

\* \* \* \* \*